US007162381B2

(12) United States Patent
Boor et al.

(10) Patent No.: US 7,162,381 B2
(45) Date of Patent: Jan. 9, 2007

(54) SYSTEM AND METHOD FOR FACILITATING LISTENING

(75) Inventors: Steven E. Boor, Plano, TX (US); Paris N. Tsangaris, Naperville, IL (US)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 10/736,151

(22) Filed: Dec. 15, 2003

(65) Prior Publication Data

US 2004/0125972 A1 Jul. 1, 2004

Related U.S. Application Data

(60) Provisional application No. 60/433,486, filed on Dec. 13, 2002.

(51) Int. Cl.
*G01R 27/00* (2006.01)
*H04R 25/00* (2006.01)

(52) U.S. Cl. ........................ 702/65; 381/312; 381/313; 381/329

(58) Field of Classification Search .................. 702/65; 381/312–331
See application file for complete search history.

(56) References Cited

U.S. PATENT DOCUMENTS 4,467,145 A 8/1984 Borstel
4,700,211 A * 10/1987 Popovic et al. ............. 257/423
5,592,079 A * 1/1997 Scheel ................... 324/207.25
6,636,645 B1 10/2003 Yu et al.
2002/0039428 A1* 4/2002 Svajda et al. ............... 381/331
2003/0059073 A1* 3/2003 Bren et al. .................. 381/312
2003/0059076 A1 3/2003 Martin
2004/0052392 A1* 3/2004 Sacha et al. ................ 381/331
2004/0179707 A1* 9/2004 Lundh ........................ 381/314

FOREIGN PATENT DOCUMENTS

EP 1 196 008 A2 4/2002
EP 1 398 994 A2 3/2004

OTHER PUBLICATIONS

Doyle et al., "High Sensitivity, Low Power, Silicon Magnetic Field Detector," IEEE, Custom Integrated Circuits Conference, 1994, pp. 275-277.
International Search Report for Application No. PCT/US03/40130 dated Dec. 21, 2004.

* cited by examiner

*Primary Examiner*—Carol S. W. Tsai
*Assistant Examiner*—Janet L Suglo
(74) *Attorney, Agent, or Firm*—Marshall, Gerstein & Borun LLP

(57) ABSTRACT

A system and method for assisting listening wherein an integrated circuit selects one or more audio sources from among a plurality audio sources to be presented to a signal processing circuit. Selection of the audio source can be automatically executed in response to detection of an external magnetic field, such as from a telephone handset, or manually controlled by a user input.

10 Claims, 3 Drawing Sheets

SYSTEM AND METHOD FOR FACILITATING LISTENING

CROSS-REFERENCE TO RELATED APPLICATIONS

This application claims the benefit of U.S. Provisional Patent Application No. 60/433,486, filed Dec. 13, 2002, the disclosure of which is hereby incorporated herein by reference in its entirety for all purposes.

TECHNICAL FIELD

This patent relates to assisted-listening systems. More specifically, this patent relates to an assisted-listening device capable of determining and adapting to surrounding environmental conditions.

BACKGROUND

Assisted-listening devices, e.g., hearing aids and the like, should be capable of operating in, and being adaptable to, several environmental conditions. For example, the assisted-listening device should to be capable of automatically selecting amongst various audio sources, e.g., telecoil, microphone, or auxiliary. One commercially available hearing aid utilizes a magnetic reed switch to provide magnetic field detection and automatic transducer mode selection. Unfortunately, there are a number of limitations associated with utilizing the magnetic reed switch. Frequently, the reed switch lacks the sensitivity to operate with many types of telephones and often requires placing an external magnet onto the telephone handset earpiece. Additionally, the reed switch requires use of a portion of the communicate device, such as a very limited space within the hearing aid. Furthermore, the reed switch may be susceptible to damage or performance changes if the hearing aid is dropped or subjected to extremely high magnetic fields—thus undermining the effective reliability of the assisted-listening system. Another shortcoming involves the added costs that are incurred to implement the reed switch into the assisted-listening system due to the additional components and manufacturing effort required.

DETAILED DESCRIPTION

Figure 1:
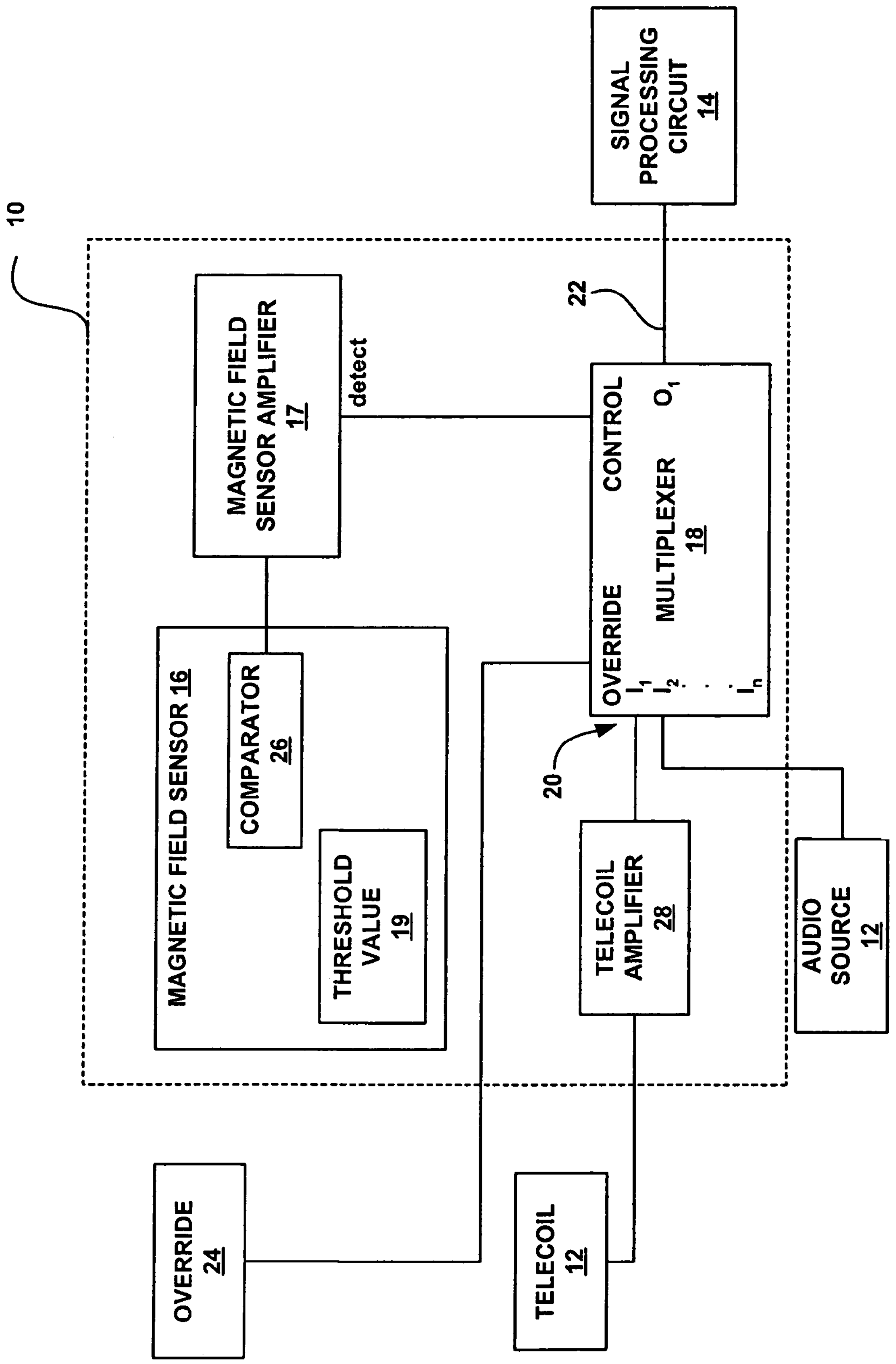
FIG. 1 is a schematic block diagram of an integrated circuit in accordance with one of the described embodiments.

One of the described embodiments is directed to a system and method for assisting listening e.g. hearing devices and methods of facilitating hearing, and the like, wherein an integrated circuit facilitates selection of an audio source mode in response to the detection of an external magnetic field. In the exemplary embodiment, an integrated circuit for an assisted-listening device is operably disposed between a plurality of audio sources and a signal processing circuit. The integrated circuit may include a magnetic field sensor and a threshold comparator. A gate, e.g., a multiplexer, may be operably coupled and responsive to the output from the magnetic field threshold comparator. The gate may include a plurality of inputs being capable of coupling to a variety of transducer outputs or auxiliary audio sources, e.g., magnetic (telecoil), acoustic (microphone). In response to the presence of a magnetic field, one of the audio sources or transducer outputs is selected to be output to the signal processing circuit.

In an alternate described embodiment, a manual override mode may be provided for allowing multiple audio source outputs and/or transducer outputs to be simultaneously presented to the signal processing circuit.

In still another described embodiment, an integrated circuit is operably disposed between a plurality of audio sources and a signal processing circuit. The integrated circuit may include a sensor for detecting an external magnetic field presence. A magnetic field threshold comparator may be operably connected to the sensor. A gate is operably responsive to the magnetic field threshold comparator. The gate includes a plurality of inputs and a gate output. The plurality of inputs are connected to the plurality of audio sources. The gate output comprises a plurality of mode signals and is connected to the signal processing circuit. The gate output is responsive to the magnetic field threshold comparator such that detection of the external magnetic field enables one of the plurality of audio source signals to be presented to the signal processing circuit.

In another described embodiment, an integrated circuit may include a sensor for detecting an external magnetic field presence. A magnetic field threshold comparator may include a first input operably connected to a magnetic field threshold value and a second input operably connected to the sensor. The magnetic field threshold comparator further includes an output being adaptable for connecting to a signal processing circuit. The output comprises a first signal and a second signal and is determined in response to the comparison of the sensed external magnetic field and the magnetic field threshold value wherein the first signal is presented to the signal processing circuit when the magnetic field threshold value exceeds the sensed external magnetic field and the second signal is presented to the signal processing circuit when the sensed external magnetic field exceeds the magnetic field threshold value.

Although the following text sets forth a detailed description of numerous different embodiments of the invention, it should be understood that the legal scope of the invention is defined by the words of the claims set forth at the end of this patent. The detailed description is to be construed as exemplary only and does not describe every possible embodiment of the invention because describing every possible embodiment would be impractical, if not impossible. Numerous alternative embodiments could be implemented, using either current technology or technology developed after the filing date of this patent, which would still fall within the scope of the claims defining the invention. Moreover, structure, features and functions of the herein described embodiments should be considered interchangeable, and every structure, feature or function may be used with any of the embodiments herein described.

It should also be understood that, unless a term is expressly defined in this patent using the sentence "As used herein, the term '______' is hereby defined to mean . . . " or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term by limited, by implication or otherwise, to that single meaning. Unless a claim element is defined by reciting the word "means" and a function without the recital of any structure, it is not intended that the scope of any claim element be interpreted based on the application of 35 U.S.C. § 112, sixth paragraph.

FIG. 1 depicts an integrated circuit 10, shown in dotted lines, operably disposed between a plurality of audio sources 12 and a signal processing circuit 14. The integrated circuit 10 includes an magnetic field sensor 16 a magnetic field sensor amplifier 17 and a gate 18. The gate 18, preferably a multiplexer, is operably responsive to the output from the magnetic field sensor amplifier 17. The magnetic field sensor 16 may include a threshold comparator 26 wherein detection of a magnetic field is based upon whether the magnetic field strength detected is above or below a threshold level. The threshold level 19 can be fixed or adjustable. The magnetic field sensor amplifier 17 provides an output signal to the gate 18 to ensure desired operation.

The gate 18 includes a plurality of inputs 20 for receiving the outputs of transducers or auxiliary audio sources, e.g., magnetic (telecoil) 12 via coupled magnetic telecoil amplifier 28, acoustic (microphone) 13.

Figure 2:
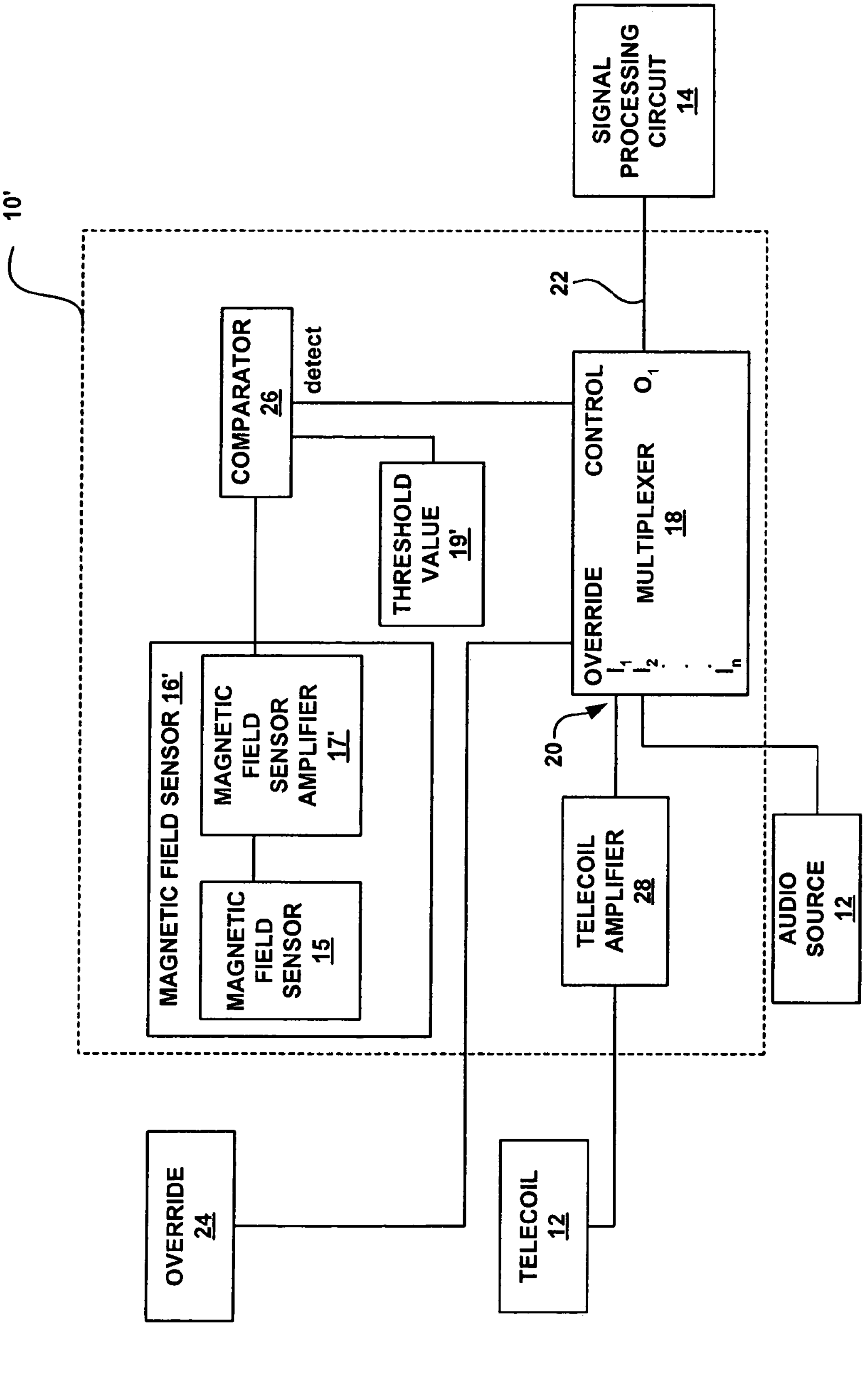
FIG. 2 is a schematic block diagram of an integrated circuit in accordance with another of the described embodiments; and, FIG. 3 is a schematic block diagram of an integrated circuit in accordance with still another of the described embodiments.

FIG. 2 depicts an alternate embodiment of an integrated circuit 10'. It is to be understood that the present invention may be embodied in these and other configurations. Circuit design preferences, manufacturing constraints, etc., are only a few of the many parameters that may influence whether certain devices, e.g., gate 18, are to be included in the configuration of the integrated circuit.

Figure 3:
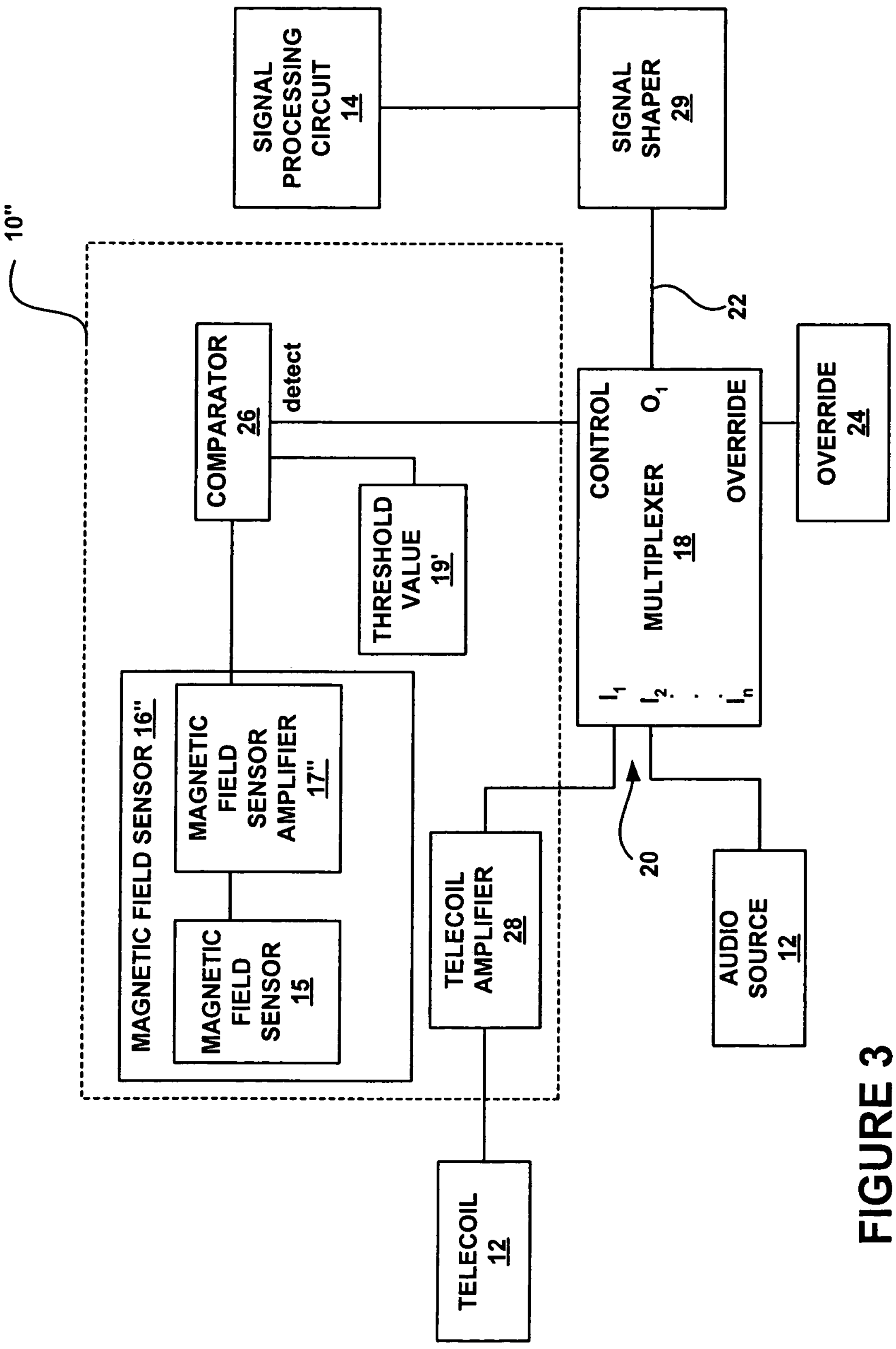

The integrated circuit 10' includes a magnetic field sensor 16' that integrates therewith the magnetic field sensor 15 and a magnetic filed sensor amplifier 17'. An output of the magnetic field sensor 16' is coupled to a threshold comparator 26 which also couples a threshold value input 19'. The output of the threshold comparator 26 is then coupled to the gate 18. The threshold level again may be fixed or adjustable. FIG. 3. depicts an alternate embodiment of an integrated circuit 10" including a magnetic field sensor 16" having a magnetic field sensor 17", similar to that illustrated in FIG. 2 as integrated circuit 10'. As shown in FIG. 3, signal shaping devices 29, e.g., biasing elements, amplifiers, filters, rectifiers, etc., and other circuit devices may also be incorporated in the design of the integrated circuit 10".

Any of the embodiments of the integrated circuit 10, 10' and 10" may further include a manual override 24, which allows one or more than one of the plurality of inputs 20 to be manually selected and presented to the signal processing circuit 14.

Several techniques may be utilized to detect the presence of the external magnetic field—often referred to as a B-field—for the control of the gate 18, e.g., microphone-telecoil multiplexer (MT MUX) in presenting a signal to the signal processing circuit 14. Some B-field detection methods include, but are not limited to:

- detection of a static B-field above or below a certain threshold level (the detection level can be hysteretic to guard against oscillatory behavior);
- detection of the AC EMF generated by the telecoil when merely bringing the telephone handset into close proximity of the telecoil;
- detection of the AC EMF generated by the telecoil in response to the audio signal transmitted by a telephone handset or a room loop; or,
- any combination of the above.

The static B-field detection method may be preferred because it is more robust in the presence of electromagnetic interference (EMI)—either environmental or man-made. The other external B-field detection methods are susceptible to "false" B-field detection from EMI, which may result in an undesirable transducer mode selection change that would require user intervention to correct. Although all three detection methods may initially respond unfavorably to EMI, the first method is capable of automatically reverting back to proper transducer mode operation without user intervention once the EMI event has subsided.

Another advantage of the static B-field detection method is that it can be configured with amplifiers which operate only at low frequencies, i.e., a very low bandwidth requirement, on the order of 10 Hz. This is very advantageous for the development of a detector and control circuit which operate with minimum power consumption.

There are several possible semiconductor, e.g., solid-state silicon, devices that could be utilized as detectors for the static B-field of a telephone handset. The silicon external B-field detectors may include: a lateral bipolar magnetotransistor (LBMT), a split-drain MAGFET, or a microelectromechanical system (MEMS) type device. A standard Hall effect sensor may also be utilized.

Advantages of using the LBMT are: it is a very sensitive silicon device for the detection of B-fields; it is less noisy than the MAGFET device; and, it detects B-fields that are tangential to the silicon surface—which would be in the same direction as the maximum sensitivity of the telecoil, when using standard mounting methods to attach the IC to the body of the telecoil. Unlike the LBMT, the MAGFET and standard Hall effect sensor are sensitive to B-fields that are perpendicular to the silicon surface. This is a potential disadvantage for the LBMT that may require non-standard mounting techniques to attach the IC to the telecoil body to ensure that the telecoil has the same maximum B-field sensitivity orientation direction as the sensor device.

For assisted-listening device applications, power consumption of the B-field sensor should be 100 microwatts or less to extend the battery life of the hearing aid as much as possible. At this power level, it is possible that the MAGFET may also provide adequate sensitivity for use as a B-field sensor since LBMTs are routinely operated at milliwatt power levels to obtain high B-field detection sensitivity. However, the LBMT could be operated at a low duty cycle to save power, since the B-field detection circuitry does not require continuous operation.

Because both the LBMT and the split-drain MAGFET can be utilized to generate a differential current output that is proportional to the B-field strength, either device could be readily integrated into the same silicon integrated circuit with a telecoil preamplifier commonly incorporated in assisted-listening devices. The other amplifier circuitry needed to convert the detector differential current output into a digital signal—utilized to control the transducer selection mode needed for MT MUX operation—could also be easily integrated into the same silicon IC with all of the above circuitry. Note that a standard Hall effect sensor operates in voltage mode, so an alternative voltage based signal processing architecture would be necessary to generate the desired control signal for MT MUX operation.

It is to be understood that embodiments and implementations of the invention are not limited to the particular magnetic field detection method, and the implementation of other semiconductor devices for magnetic field detection is within the scope of the present invention.

In addition, an override switch can be utilized to control MT MUX operation and provide a user the ability to manually select a mode of operation that allows both the telecoil and microphone outputs—or other audio sources—to be presented simultaneously to the signal processing circuit of an assisted-listening device. This feature is desirable in listening environments such as churches, auditoriums, and classrooms that are often wired with magnetic room loops to assist the hearing impaired wherein hearing aid users can simultaneously utilize the magnetic and the acoustic audio information supplied in these situations.

As discussed above, many of the limitations of today's assisted-listening devices are addressed by the described embodiments. For example, each of the embodiments is capable of being readily incorporated with telecoil preamplifier electronics in "active telecoil" transducers at very low cost onto the same integrated circuit. Additional benefits that may include:

providing the ability to automatically detect whether a telephone handset is in close proximity;

providing the ability to automatically select the appropriate audio source, i.e., microphone output, to be output to the signal processing circuitry of an assisted-listening device when the external magnetic field strength is less than a predetermined threshold level;

providing the ability to automatically select the appropriate audio source, i.e, telecoil output, to be output to the signal processing circuitry of an assisted-listening device when the external magnetic field strength is greater than a predetermined threshold level;

providing improved assisted-listening device reliability through an integrated circuit design that is more resilient and less susceptible to damage or performance shifts;

efficiently utilizing existing available space within the assisted-listening device; and, reducing the complexity and cost of the assembly process for assisted-listening device manufacturers by reducing the number of device components.

Other modifications and alternative embodiments of the invention will be apparent to those skilled in the art in view of the foregoing description. This description is to be construed as illustrative only, and is for the purpose of teaching those skilled in the art the best mode of carrying out the invention. The details of the structure and method may be varied substantially without departing from the spirit of the invention, and the exclusive use of all modifications which come within the scope of the appended claims is reserved.

What is claimed is:

1. An integrated circuit being operably disposed between a plurality of audio sources and a signal processing circuit, the integrated circuit comprising:

a magnetic field sensor;

a magnetic field threshold comparator and a magnetic field threshold value, the magnetic field threshold comparator being operably coupled to the magnetic field sensor and the magnetic field threshold value;

a gate being operably responsive to the magnetic field threshold comparator, the gate including a plurality of gate inputs and a gate output, the plurality of gate inputs being operably coupled to the plurality of audio sources, and the gate output being operably coupled to the signal processing circuit, wherein one of the plurality of audio sources is selected to be presented to the signal processing circuit in response to the magnetic field threshold comparator output; and a manual override, operable to couple one or more of the plurality of audio sources to the signal processing circuit.

2. The integrated circuit of claim 1 wherein the magnetic field sensor has a power consumption of substantially 100 μW or less.

3. The integrated circuit of claim 1 wherein the magnetic field sensor is a lateral bipolar magnetotransistor.

4. The integrated circuit of claim 1 Wherein the magnetic field sensor is a split-drain MAGFET.

5. The integrated circuit of claim 1 wherein the magnetic field sensor is a Hall effect sensor.

6. The integrated circuit of claim 1 wherein the magnetic field sensor is a micro-electromechanical system (MEMS) device.

7. The integrated circuit of claim 1 wherein the magnetic field sensor is an external telecoil.

8. The integrated circuit of claim 1 being operably coupled to a signal processing device selected from the group consisting of biasing, amplifying, filtering, and rectifying devices.

9. For an assisted-listening device having an integrated circuit based magnetic field sensor and gate selector, a method for facilitating listening comprising the steps of:

providing a magnetic field threshold level;

receiving a magnetic field input level;

comparing the magnetic field threshold level to the magnetic field input level; and, selecting one of the plurality of audio sources to be presented to a signal processing circuit in response to the comparison of the magnetic field threshold level and the magnetic field input; and providing a manual override to allow manual selection of one or more of the plurality of audio sources to be presented to the signal processing circuit.

10. The method of claim 9 further comprising providing an integrated telecoil preamplifier operably coupled between the selected audio source and the gate.

* * * * *

UNITED STATES PATENT AND TRADEMARK OFFICE

CERTIFICATE OF CORRECTION

PATENT NO. : 7,162,381 B2
APPLICATION NO. : 10/736151
DATED : January 9, 2007
INVENTOR(S) : Steven E. Boor et al.

It is certified that error appears in the above-identified patent and that said Letters Patent is hereby corrected as shown below:

At column 6, line 23, "Wherein" should be -- wherein --.

At column 6, line 45, "magnetic field input" should be -- magnetic field input level --.

Signed and Sealed this

Seventh Day of August, 2007

JON W. DUDAS
*Director of the United States Patent and Trademark Office*